United States Patent [19]

Cowles et al.

[11] Patent Number: 5,663,658
[45] Date of Patent: *Sep. 2, 1997

[54] LOW CURRENT REDUNDANCY FUSE ASSEMBLY

[75] Inventors: Timothy B. Cowles; Steven G. Renfro, both of Boise, Id.

[73] Assignee: Micron Technology, Inc., Boise, Id.

[*] Notice: The term of this patent shall not extend beyond the expiration date of Pat. No. 5,424,672.

[21] Appl. No.: 631,449

[22] Filed: Apr. 12, 1996

Related U.S. Application Data

[63] Continuation of Ser. No. 452,203, May 26, 1995, Pat. No. 5,508,638, which is a continuation of Ser. No. 201,432, Feb. 24, 1994, Pat. No. 5,424,672.

[51] Int. Cl.$^6$ .................... H03K 19/003; H03K 19/173
[52] U.S. Cl. .................... 326/10; 326/38; 327/525
[58] Field of Search ................ 326/38, 10; 327/525

[56] References Cited

U.S. PATENT DOCUMENTS

| | | |
|---|---|---|
| 3,721,838 | 3/1973 | Brickman et al. |
| 4,689,494 | 8/1987 | Chen et al. ................ 326/38 |
| 4,791,319 | 12/1988 | Tagami et al. .............. 327/525 |
| 4,847,810 | 7/1989 | Tagami ..................... 327/525 |
| 5,059,835 | 10/1991 | Lauffer et al. .............. 326/38 |
| 5,099,149 | 3/1992 | Smith ...................... 326/38 |
| 5,301,143 | 4/1994 | Ohri et al. ................. 365/96 |
| 5,301,159 | 4/1994 | Lee ........................ 365/225.7 |
| 5,424,672 | 6/1995 | Cowles et al. .............. 327/525 |
| 5,446,695 | 8/1995 | Douse et al. ............... 365/222 |
| 5,457,659 | 10/1995 | Schaefer ................... 365/222 |
| 5,485,031 | 1/1996 | Zhang et al. ............... 257/530 |
| 5,485,032 | 1/1996 | Schepis et al. ............. 257/530 |
| 5,486,707 | 1/1996 | Look et al. ................ 257/52 |
| 5,486,776 | 1/1996 | Chiang .................... 326/41 |
| 5,495,181 | 2/1996 | Kolze ..................... 326/38 |
| 5,495,436 | 2/1996 | Callahan .................. 365/96 |
| 5,498,895 | 3/1996 | Chen ...................... 257/355 |
| 5,502,000 | 3/1996 | Look et al. ................ 437/60 |
| 5,502,333 | 3/1996 | Bertin et al. ............... 257/685 |
| 5,502,668 | 3/1996 | Shimoji et al. ............. 365/185.28 |
| 5,502,674 | 3/1996 | Griffus et al. .............. 365/200 |
| 5,506,518 | 4/1996 | Chiang .................... 326/41 |
| 5,508,638 | 4/1996 | Cowles et al. .............. 326/38 |

*Primary Examiner*—Edward P. Westin
*Assistant Examiner*—Richard Roseen
*Attorney, Agent, or Firm*—Trask, Britt & Rossa

[57] ABSTRACT

In a microcircuit device such as a memory chip, where a bank of fuse-controlled latch pulse routing-circuits are used to program redundant circuits or other programming options with every memory cycle or multiple thereof, the amount of current drawn by every fuse-control circuit is reduced by controlling each bank of circuits with a bank-enabling, fuse-programmed circuit between the latch pulse source and the bank of fuse-controlled programming circuits, and by adding a second fuse into each programming circuit; whereby, the bank of programming circuits can be enabled by alternately blowing one of two fuses in the bank-enabling circuit, and each programing logic can be set by alternately blowing one of its pair of fuses, thus cutting off any current path through the programming circuit regardless of the programming state of the circuit.

41 Claims, 3 Drawing Sheets

LOW CURRENT REDUNDANCY FUSE ASSEMBLY

This is a continuation of parent application Ser. No. 08/452,203 filed May 26, 1995 now U.S. Pat. No. 5,508,638, which is a continuation of application Ser. No. 08/201,432 filed Feb. 24, 1994 and now U.S. Pat. No. 5,424,672.

FIELD OF THE INVENTION

This invention relates to the testing of microelectronic modules, and more specifically to the use of fuse-controlled enabling or disabling logic circuits such as the ones used to disable a portion of a memory array found to be defective during wafer-level testing.

BACKGROUND OF THE INVENTION

Semiconductor integrated circuits contain large numbers of electronic components such as diodes and transistors built on a single chip. Due to the microscopic scale of these circuits, they are susceptible to component defects due to material impurities and fabrication hazards.

In order to circumvent this problem, redundant components and/or circuits are built on every chip that can be switched-in in lieu of corresponding circuits found defective during testing. Usually the switching-out of a defective component or circuit and the switching-in of a corresponding redundant element is accomplished by using programming logic circuits which are activated by blowing certain fuses built into the chip circuitry.

FIG. 1 illustrates a typical fuse-controlled programming circuit of the prior art.

A bank 1 of N programming logic circuits 2 is interrogated by a latch pulse appearing on a latch pulse line 3 connected to control terminals of the logic circuits 2. Each programming logic circuit comprises a fuse 4 wired in series with a switching transistor 5 between a supply voltage VCC and its ground reference. The node 6 between the fuse and the switching transistor is wired into the input of a driver 7. The output of the driver is typically used to set a latching circuit which disables the defective circuit and enables a substitute from the redundant circuit bank. The latch pulse is allowed to pass through the programming logic circuit 2 only after the fuse 4 has been blown. So long as the fuse 4 short-circuits the node 6 to the reference ground the output of the driver 7 remains high regardless of the presence of the latch pulse on its control terminal. It should be noted that as long as the fuse 4 remains intact, current is drawn through it and through the switching transistor 5 during the period of every latch pulse. This type of programming logic circuit is commonly used in connection with memory chips wherein a latch pulse is usually issued with every memory cycle. As more programming logic circuits of this type are placed on a wafer and not programmed by blowing their fuses, the cumulative current drawn with every latch pulse occurring with every memory cycle can be significant and enough to affect the operation of the microcircuit.

A common solution found throughout the prior art to this problem is to pulse the programming logic circuit, i.e., issue a latch pulse, only once upon powering up the chip in order to latch-in the proper redundancy scheme or other control option. However, pulsing the circuits during the power up cycle does not guarantee that the proper redundancy or other option then set will not be unlatched sometime later during the operation of the chip as a result of a power surge, background noise or other form of transient. Without any other pulsing of the programming logic circuit until the next power up, there is no way the circuit can correct itself in such cases of spurious unlatching. Moreover, there is never any guarantee that the correct program can be latched-in with one single initial pulse. It is therefore preferable to issue a latch pulse with every memory cycle or multiples thereof to assure, not only a correct original latching-in of the programming scheme, but also an automatic correction of any spurious malfunction.

Accordingly, there is a need to find a palliative to the excessive drawing of current by banks of such programming logic circuits used to latch-in redundancy circuits and other programming options.

SUMMARY OF THE INVENTION

The principal and secondary objects of this invention are to improve the performance of microcircuits that use fuse-controlled programming circuits to latching-in redundancy circuits and other programming options, by limiting the amount of current drawn through each unblown fuses, and to do so without limiting the frequency of the latching-in cycle in connection, in particular, with memory chips wherein large arrays of identical components are prone to be backed up by several columns or rows of redundant circuits which are preferably programmed with every memory cycle.

These and other objects are achieved by adding a fuse-controlled enabling circuit for every bank of latch-programming circuits, and adding a second fuse to every fuse-controlled circuit in the bank; whereby the bank can be enabled or disabled, and the logic circuit can be programmed by blowing either one of the pair of fuses associated with each circuit. Since one of the fuses is always blown, the current flow through the remaining fuses is stopped or considerably reduced no matter how the circuit is programmed.

BRIEF DESCRIPTION OF THE DRAWINGS

FIG. 3 is a logic truth-table of the latch pulse routing circuit operation;

DESCRIPTION OF THE PREFERRED EMBODIMENT OF THE INVENTION

Figure 1:
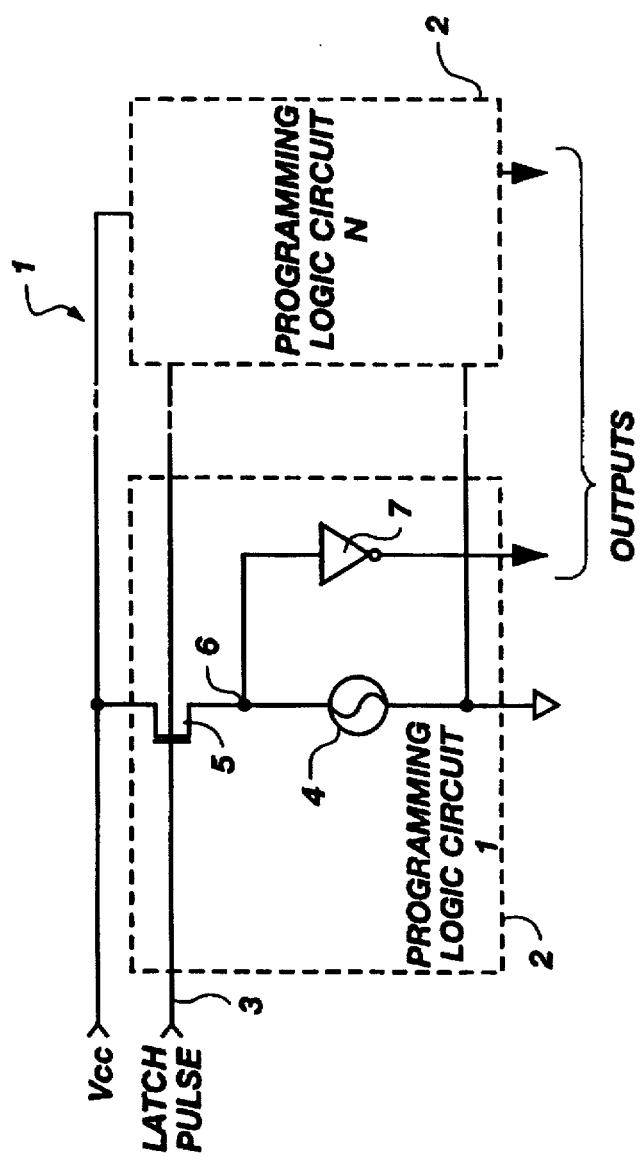
FIG. 1 illustrates a bank of programming logic circuits for routing a latching pulse according to the prior art.
Figure 2:
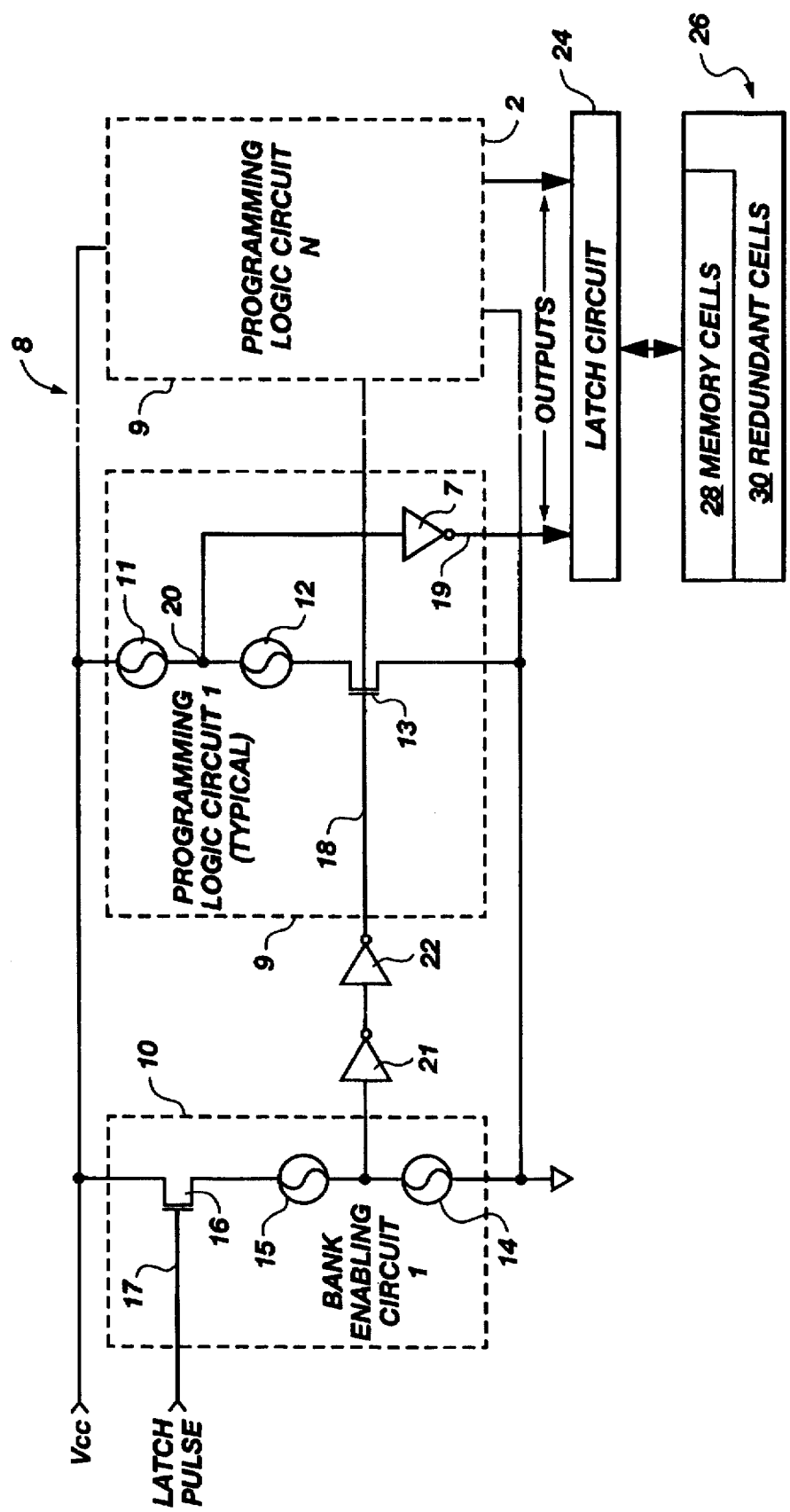
FIG. 2 is a schematic of a latching pulse-routing circuit according to the invention.

Referring now to the drawings, there is shown in FIG. 2 an improved version 8 of the bank of N programming logic circuits illustrated in FIG. 1 used in connection with a well-known latch circuit 24 and a typical memory array 26 including memory cells 28 and redundant cells 30. The improvement consists essentially of adding an extra one to the bank of programming logic circuits 9 to act as a bank-enabling circuit 10, of adding to each original blowable fuse 11 in each programming logic circuit 9 a second fuse 12 between the switching transistor 13 and the original fuse 11, and of adding to a first fuse 14 of the bank-enabling circuit 10 a second fuse 15 wired between the switching transistor 16 and the first fuse 14. The latch pulse line 17 is routed through the bank-enabling circuit 10 by connecting its source to a controlling input of the bank-enabling circuit transistor 16, then connecting the junction between the two fuses 14, 15 of the bank-enabling circuit to each of the controlling input terminals 18 of the switching transistor 13 in each programming logic circuit 9. The output signal 19 of each programming logic circuit is derived from the junction 20 between the two fuses 11, 12 at which the voltage is indicative of the status of those fuses in accordance with the truth-table illustrated in FIG. 3. In the truth-table, a "0" indicates that the fuse is intact, and a "1" stands for a blown fuse. In the output, "0" means that no latch-pulse signal is-transmitted (ON condition), and a "1" indicates the free transmittal of the latch-pulse (OFF condition). The bank-enabling circuit 10 as well as each of the programming logic circuits 9 must be set by alternately blowing either one of the pair of fuses in each circuit. It should be noted, however, that if none of the bank-enabling circuit fuses 14, 15 are blown, the result is similar as having blown only the bank-disabling fuse 15, i.e., outputs 19 will remain in the OFF state. It should also be noted that if the bank-disable fuse 15 is blown, it does not matter whether the OFF-fuse 12 of each programming logic circuit is blown or not, the output signal 19 are always disabled. However, if both the bank disable fuse 15 and the ON-fuse 11 are blown the circuit will not work because node 20 will be in an undetermined state. When the bank-enable fuse 14 is blown, then the status of the output will be ON if the ON-fuse 11 has been blown, but would be OFF if the OFF-fuse 12 has been blown.

Figure 4:
FIG. 4 is a schematic of an alternative current conduit for the circuit of FIG. 2.

Although, in FIG. 2, the location of the bank-enabling circuit fuses 14, 15 in relation to the switching transistor 16 is opposite to the position of the fuses 11, 12 in relation to the switching transistor 13 in the programming logic circuits, the former position can be inverted and one of the drivers 21, 22 suppressed without affecting the logic operation of the circuits. It should also be understood that while the programming logic circuits and the bank-enabling circuits are illustrated in a simplified form wherein the fuses are wired directly in series with the switching transistors, the same concept of adding a bank-enabling circuit combined with the addition of second fuses to the programming logic circuits could be applied to other circuits wherein the blowable fuses are not necessarily in series with a switching transistor. For example, as shown in FIG. 4 a resistor 32 or any other type of device capable of feeding or transmitting current into the fuses, could be used in lieu of a transistor. Thus, various equivalents of the above-described embodiment of the invention can be devised by people skilled in the electronic arts following the basic principle underlying this invention that calls for blowing one of the two serially connected fuses in all cases in order to cut off the current path through any unblown fuse.

Figure 5:
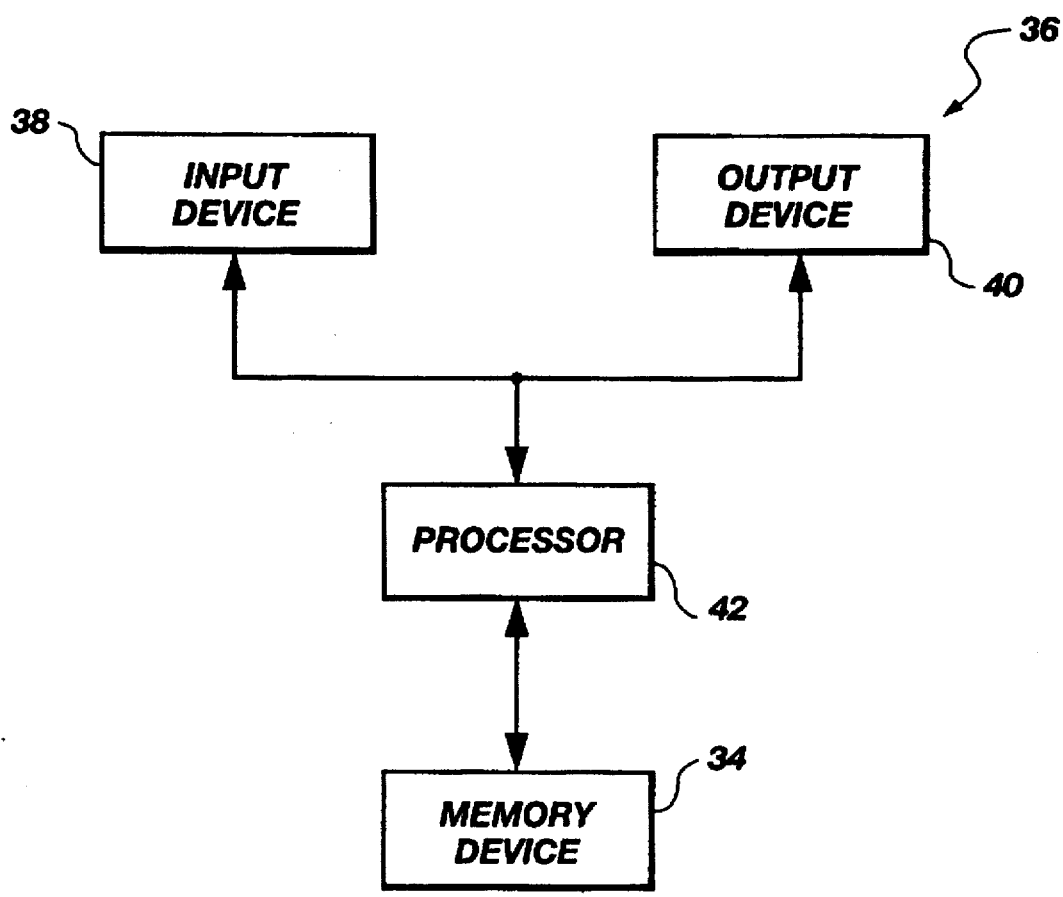
FIG. 5 is a block diagram of a computer system including the circuit of FIG. 2.

As shown in FIG. 5, the circuitry of FIG. 2 is incorporated into a memory device 34 in a computer system 36 that also includes an input device 38, an output device 40, and a processor 42.

While the preferred embodiment of the invention has been described, modifications can be made and other embodiments may be devised without departing from the spirit of the invention and the scope of the appended claims.

What is claimed is:

1. In a microcircuit device having at least one programming logic circuit, said logic circuit including a first programming fuse in series with a switching transistor and a control line connected to a node between said first programming fuse and said switching transistor, a latch pulse source being connected to a control terminal of said switching transistor to generate on said control line a logic level representative of the status of said first programming fuse, an improvement for reducing the current drawn through said first programming fuse comprising:

a second programming fuse connected in series with said first programming fuse between said node and said switching transistor; and an enabling circuit connected between said latch pulse source and the control terminal of said switching transistor, said enabling circuit comprising:

an enabling transistor having a control terminal connected to said latch pulse source, a first current-carrying terminal connected to a first voltage, and a second current-carrying terminal;

a first enabling fuse having first and second terminals, the first terminal being connected to the enabling transistor's second current-carrying terminal and the second terminal being connected to the control terminal of said switching transistor; and a second enabling fuse having a first terminal connected to the second terminal of said first enabling fuse and a second terminal connected to a second voltage;

whereby programming said first enabling fuse disables said logic circuit, and programming said second enabling fuse allows the passage of a latch pulse through said enabling circuit to said logic circuit.

2. The improvement of claim 1, wherein said first voltage comprises a supply voltage and said second voltage comprises a circuit ground reference.

3. The improvement of claim 1, wherein said logic circuit is connected to an array of microcircuit devices.

4. The improvement of claim 1, wherein said logic circuit is connected to a microcircuit memory array.

5. A method for reducing the amount of current drawn by a bank of programming circuits wherein each circuit includes a current transmitting device mounted in series with a first fuse between a supply voltage and a reference voltage, said method comprising:

adding an extra one of said programming circuits to said bank as a bank-enabling circuit;

in each one of said programming and bank-enabling circuits, adding a second fuse in series between said first fuse and said current transmitting devices;

programming each of said programming and bank-enabling circuits by blowing one of said first and second fuses in each circuit;

driving each of said programming circuits with a signal derived from the junction of said first and second fuses in said bank-enabling circuit; and using the junction of said first and second fuses in each of said programming circuits as an output indicative of the status of the fuses in said programming circuits.

6. The method of claim 5 further comprising using a transistor as said current transmitting device in said bank-enabling circuit and applying an interrogating signal to a control input of said transistor.

7. A method for reducing the amount of current drawn through a blowable fuse associated with a programming logic circuit, the method comprising:

adding a second fuse in series with said blowable fuse;

setting said programming logic circuit by blowing one of said fuses; and using a signal at a junction of said fuses as an indication of the status of said fuses.

8. A programmable circuit for outputting a logic signal in a predetermined logic state, the programmable circuit comprising:

a current conduit having a voltage terminal coupled to a first voltage associated with a first logic state and an output terminal for outputting the first voltage; and a programmable device having an input terminal coupled to the current conduit's output terminal, a voltage terminal coupled to a second voltage different than the first voltage and associated with a second logic state, and an output terminal programmably coupleable to the input terminal for outputting the logic signal in the first logic state and to the voltage terminal for outputting the logic signal in the second logic state.

9. The programmable circuit of claim 8 wherein the current conduit comprises a resistance circuit.

10. The programmable circuit of claim 9 wherein the resistance circuit comprises a resistor.

11. The programmable circuit of claim 9 wherein the resistance circuit comprises a resistance-connected transistor.

12. The programmable circuit of claim 8 wherein the current conduit also includes a control terminal for receiving a latch signal from external circuitry and wherein the current conduit's output terminal is switchably coupleable to its voltage terminal in response to the latch signal.

13. The programmable circuit of claim 12 wherein the current conduit comprises a control switch.

14. The programmable circuit of claim 13 wherein the control switch comprises a transistor.

15. The programmable circuit of claim 8 wherein one of the first and second voltages is a reference voltage and the other of the first and second voltages is a supply voltage.

16. The programmable circuit of claim 15 wherein the reference voltage is ground.

17. The programmable circuit of claim 8 wherein one of the first and second logic states is a logic "0" state and the other of the first and second logic states is a logic "1" state.

18. The programmable circuit of claim 8 wherein the programmable device comprises first and second programmable elements coupled in series between the current conduit's output terminal and the second voltage, the logic signal being output from a node between the programmable elements.

19. The programmable circuit of claim 18 wherein the programmable elements comprise fuses and the output terminal of the programmable device is programmably coupleable to one of the input and voltage terminals of the programmable device by blowing the fuse between the output terminal and the other of the input and voltage terminals.

20. A programmable circuit for outputting a logic signal in a predetermined logic state, the programmable circuit comprising at least two programmable elements and a current conduit coupled in series between a supply voltage and a reference voltage, the supply voltage being associated with a first logic state and the reference voltage being associated with a second logic state, the programmable elements being programmable to alter current flow therethrough such that a node between the programmable elements is programmably coupleable to the supply voltage for outputting the logic signal in the first logic state and to the reference voltage for outputting the logic signal in the second logic state.

21. The programmable circuit of claim 20 wherein the current conduit comprises a resistance circuit.

22. The programmable circuit of claim 20 wherein the current conduit comprises a control switch responsive to a latch signal.

23. The programmable circuit of claim 22 wherein the control switch comprises a transistor.

24. The programmable circuit of claim 20 wherein the programmable elements comprise fuses and the node between the programmable elements is programmably coupleable to one of the supply and reference voltages by blowing the fuse between the node and the other of the supply and reference voltages.

25. A logic circuit for outputting a logic signal in a predetermined logic state in response to a latch signal, the logic circuit comprising:

an enabling circuit comprising an enabling switch and at least two enabling programmable elements coupled in series between a supply voltage and a reference voltage, the supply voltage being associated with a first logic state and the reference voltage being associated with a second logic state, the enabling switch receiving the latch signal and being responsive thereto, the enabling programmable elements being programmable to alter current flow therethrough such that a node between the elements is programmably coupleable to one of the supply and reference voltages for outputting an enabling signal when the latch signal closes the enabling switch; and a programmable circuit comprising a control switch and at least two output-programmable elements coupled in series between the supply voltage and the reference voltage, the control switch being coupled to the node between the enabling programmable elements for receiving the enabling signal and being responsive thereto, the output programmable elements being programmable to alter current flow therethrough such that a node between the output programmable elements is programmably coupleable to one of the supply and reference voltages for outputting the logic signal in the first or second logic state, respectively, when the enabling signal closes the control switch.

26. The logic circuit of claim 25 wherein the enabling and control switches each comprise a transistor.

27. The logic circuit of claim 25 wherein the programmable elements comprise fuses so each of the nodes between the programmable elements is programmably coupleable to one of the supply and reference voltages by blowing the fuse between the node and the other of the supply and reference voltages.

28. The logic circuit of claim 25 wherein the enabling circuit and the programmable circuit are provided on a single semiconductor.

29. An integrated circuit die comprising:

an enabling transistor and at least two enabling fuses coupled in series between a supply voltage conductor and a reference voltage conductor, the supply voltage being associated with a first logic state and the reference voltage being associated with a second logic state, the enabling transistor being connectable to receive a latch signal from external circuitry and being responsive thereto, the enabling fuses being blowable to alter current flow therethrough such that a node between the fuses is programmably coupleable to one of the supply and reference voltage conductors for outputting an enabling signal when the latch signal rams the enabling transistor on; and a control transistor and at least two output fuses coupled in series between the supply voltage conductor and the reference voltage conductor, the control transistor being coupled to the node between the enabling fuses for receiving the enabling signal and being responsive thereto, the output fuses being "blowable" to alter current flow therethrough such that a node between the output fuses is programmably coupleable to one of the supply and reference voltage conductors for outputting the logic signal in the first or second logic state, respectively, when the enabling signal closes the control transistor.

30. An integrated circuit package comprising a programmable circuit for outputting a logic signal in a predetermined logic state, the programmable circuit comprising at least two programmable elements and a current conduit coupled in series between a supply voltage conductor and a reference voltage conductor, the supply voltage being associated with a first logic state and the reference voltage being associated with a second logic state, the programmable elements being programmable to alter current flow therethrough such that a node between the programmable elements is programmably coupleable to the supply voltage conductor for outputting the logic signal in the first logic state and to the reference voltage conductor for outputting the logic signal in the second logic state.

31. The integrated circuit package of claim 30 wherein the current conduit comprises a resistance circuit.

32. The integrated circuit package of claim 30 wherein the current conduit comprises a control switch responsive to a latch signal.

33. The integrated circuit package of claim 32 wherein the control switch comprises a transistor.

34. The integrated circuit package of claim 30 wherein the programmable elements comprise fuses so the node between the programmable elements is programmably coupleable to one of the supply and reference voltage conductors by "blowing" the fuse between the node and the other of the supply and reference voltage conductors.

35. A redundant memory system comprising:
a memory array including a plurality of memory cells and a plurality of redundant cells; and
an array accessing circuit coupled to the memory array for selectively accessing memory cells in the memory array in accordance with memory addresses received from external circuitry, the array accessing circuit including a redundancy control circuit comprising:
an enabling circuit including an enabling switch and at least two enabling programmable elements coupled in series between a supply voltage and a reference voltage, the enabling switch receiving a latch signal from external circuitry and being responsive thereto, the enabling programmable elements being programmable to alter current flow therethrough such that a node between the elements is programmably coupleable to one of the supply and reference voltages for outputting an enabling signal when the latch signal closes the enabling switch;
a bank of programmable circuits for storing programmed addresses, each programmable circuit comprising a control switch and at least two output programmable elements coupled in series between the supply voltage and the reference voltage, each control switch being coupled to the node between the enabling programmable elements for receiving the enabling signal and being responsive thereto, each of the output programmable elements being programmable to alter current flow therethrough such that a node between the output programmable elements in each programmable circuit is programmably coupleable to one of the supply and reference voltages for outputting a bit of a programmed address when the enabling signal closes each control switch; and
a latch circuit coupled to the programmable circuits for receiving programmed addresses therefrom, the latch circuit comparing the programmed addresses to received memory addresses and causing the array accessing circuit to selectively access a redundant cell in the memory array in lieu of accessing a memory cell when a received memory address corresponds to a programmed address.

36. The redundant memory system of claim 35 wherein the enabling and control switches comprise transistors.

37. The redundant memory system of claim 35 wherein the programmable elements comprise fuses so each of the nodes between the programmable elements is programmably coupleable to one of the supply and reference voltages by "blowing" the fuse between the node and the other of the supply and reference voltages.

38. A computer system comprising:
an input device;
an output device;
a processor coupled to the input and output devices; and
a memory device coupled to the processor, the memory device including a redundant memory system comprising:
a memory array including a plurality of memory cells and a plurality of redundant cells; and
an array accessing circuit coupled to the memory array for selectively accessing memory cells in the memory array in accordance with memory addresses received from the processor, the array accessing circuit including a redundancy control circuit comprising:
an enabling circuit including an enabling switch and at least two enabling programmable elements coupled in series between a supply voltage and a reference voltage, the enabling switch receiving a latch signal from the processor and being responsive thereto, the enabling programmable elements being programmable to alter current flow therethrough such that a node between the elements is programmably coupleable to one of the supply and reference voltages for outputting an enabling signal when the latch signal closes the enabling switch;
a bank of programmable circuits for storing programmed addresses, each programmable circuit comprising a control switch and at least two output programmable elements coupled in series between the supply voltage and the reference voltage, each control switch being coupled to the node between the enabling programmable elements for receiving the enabling signal and being responsive thereto, each of the output programmable elements being programmable to alter current flow therethrough such that a node between the output programmable elements in each programmable circuit is programmably coupleable to one of the supply and reference voltages for outputting a bit of a programmed address when the enabling signal closes each control switch; and
a latch circuit coupled to the programmable circuits for receiving programmed addresses therefrom, the latch circuit comparing the programmed addresses to received memory addresses and causing the array accessing circuit to selectively access a redundant cell in the memory array in lieu of accessing a memory cell when a received memory address corresponding to the memory cell also corresponds to one of the programmed addresses.

39. A method of programming a memory device having memory cells and redundant cells to generate a programmed address in response to a latch signal for comparison to memory addresses received from external circuitry, the memory device being of the type to access one of its redundant cells in lieu of accessing one of its memory cells when a received memory address matches the programmed address, the method comprising:

providing at least two enabling programmable elements and an enabling switch coupled in series between a supply voltage and a reference voltage, the enabling switch being responsive to the latch signal;

programming the enabling programmable elements to allow conduction of only one of the supply and reference voltages to an enabling node between the elements for outputting an enabling signal therefrom when the latch signal activates the enabling switch;

providing at least two output programmable elements and a control switch coupled in series between the supply and reference voltages for each bit in the programmed address, each control switch being responsive to the enabling signal, the output programmable elements associated with each bit in the programmed address having an output node therebetween for outputting their associated bit; and programming the output programmable elements associated with each bit in the programmed address to allow conduction of only one of the supply and reference voltages to their associated output node for outputting their associated bit therefrom when the enabling signal activates theft associated control switch, the output nodes thereby generating the programmed address.

40. The programming method of claim 39 wherein the step of programming the enabling programmable elements comprises blowing at least one fuse coupled in series with the enabling switch between the supply and reference voltages and wherein the step of programming the output programmable elements comprises blowing at least one fuse coupled in series with each control switch between the supply and reference voltages.

41. A method in a memory device for accessing a redundant cell of the memory device in lieu of accessing a memory cell of the memory device, the method comprising:

receiving a latch signal and, in response, switchably coupling a first voltage to an enabling node and outputting a corresponding enabling signal therefrom;

activating a control switch associated with each different bit in a programmed address in response to the enabling signal, each control switch being coupled in series with two programmable elements between the first voltage and a second voltage, the second voltage being different than the first voltage, the bit associated with each control switch corresponding to one of the first and second voltages, one programmable element coupled in series with each control switch being preprogrammed to conduct the first or second voltage corresponding to its associated bit through itself, the other programmable element coupled in series with each control switch being preprogrammed to prevent conduction of any voltages through itself;

outputting each different bit in the programmed address from an output node between the programmable elements associated with the bit and thereby outputting the programmed address;

receiving memory addresses corresponding to memory cells in the memory device;

comparing each received memory address to the programmed address; and when a received memory address and the programmed address correspond, accessing a redundant cell in the memory device in lieu of accessing the memory cell associated with the received memory address.

* * * * *

UNITED STATES PATENT AND TRADEMARK OFFICE
CERTIFICATE OF CORRECTION

PATENT NO. : 5,663,658
DATED : Sep. 2, 1997
INVENTOR(S) : Cowles et al.

It is certified that error appears in the above-identified patent and that said Letters Patent is hereby corrected as shown below:

In Column 2, line 6,   after "assure" delete the comma;

In Column 2, line 19,  change "fuses" to --fuse--;

In Column 2, line 41,  delete "and";

In Column 3, line 16,  change "outputs" to --output signal--;

In Column 3, line 19,  change "signal" to --signals--;

In Column 3, line 21,  after "blown" insert a comma;

In Column 3, line 40,  after "FIG. 4" insert a comma;

In Column 3, line 42,  after "fuses" delete the comma;

In Column 6, line 57,  change "rams" to --turns--; and

In Column 9, line 29,  change "theft" to --their--.

Signed and Sealed this

Fourteenth Day of April, 1998

Attest:

BRUCE LEHMAN

*Attesting Officer*          *Commissioner of Patents and Trademarks*